US012228962B1

(12) United States Patent
Lin

(10) Patent No.: US 12,228,962 B1
(45) Date of Patent: Feb. 18, 2025

(54) CLOCK SIGNAL SKEW CALIBRATION APPARATUS AND CONTROL METHOD

(71) Applicant: Diodes Incorporated, Plano, TX (US)

(72) Inventor: Yu-Wei Lin, Taipei (TW)

(73) Assignee: Diodes Incorporated, Plano, TX (US)

( * ) Notice: Subject to any disclaimer, the term of this patent is extended or adjusted under 35 U.S.C. 154(b) by 95 days.

(21) Appl. No.: 18/227,255

(22) Filed: Jul. 27, 2023

(51) Int. Cl.
*G06F 1/10* (2006.01)
*G06F 1/08* (2006.01)

(52) U.S. Cl.
CPC . *G06F 1/10* (2013.01); *G06F 1/08* (2013.01)

(58) Field of Classification Search
CPC .................................................... H03H 17/08
See application file for complete search history.

(56) References Cited

U.S. PATENT DOCUMENTS

| 11,005,479 | B2 | 5/2021 | Im et al. | |
|---|---|---|---|---|
| 2009/0003482 | A1* | 1/2009 | Wilhite | H03H 17/08 375/261 |
| 2011/0148498 | A1* | 6/2011 | Mosalikanti | H03H 17/08 327/237 |
| 2022/0069809 | A1* | 3/2022 | Ting | H03K 3/017 |

FOREIGN PATENT DOCUMENTS

CN 116032260 A 4/2023

OTHER PUBLICATIONS

International Search Report and Written Opinion for Application No. PCT/US2023/034190, mailed on Apr. 26, 2024, 11 pages.

* cited by examiner

*Primary Examiner* — Terrell S Johnson
(74) *Attorney, Agent, or Firm* — AP3 Law Firm PLLC; Li Li

(57) ABSTRACT

An apparatus includes a clock skew calibration circuit configured to be coupled to a multi-phase clock generator through a plurality of delay lines, wherein a first clock skew calibration unit comprises a frequency doubler configured to receive a plurality of multi-phase clock signals and generate a clock signal based on the plurality of multi-phase clock signals, a frequency divider configured to receive the clock signal and generate a reduced frequency signal based on the clock signal, and a delay line control circuit configured to compare the duty cycle of the reduced frequency signal with a predetermined duty cycle, and generate a first control signal to adjust the skew of the first multi-phase clock signal through adjusting a first delay applied to the first multi-phase clock signal until a calibrated signal of the first multi-phase clock signal is achieved.

20 Claims, 14 Drawing Sheets

CLOCK SIGNAL SKEW CALIBRATION APPARATUS AND CONTROL METHOD

TECHNICAL FIELD

Embodiments of the invention relate to a clock signal skew calibration apparatus, and, in particular embodiments, to a clock signal skew calibration apparatus for reducing clock skews of 4-phase clock signals.

BACKGROUND

Data communication systems are constantly adapted to serve the ever-increasing need for high-speed data communication. Data communication systems such as serial communication systems include a transmitter and a receiver. The transmitter modulates a lower speed parallel data bus into a higher speed serial data stream. The higher speed serial data stream is transferred through a suitable communication channel. The serial data stream travels on the communication channel and is then obtained by the receiver. The serial data stream is then processed by the receiver in order to recover the original data.

In order to achieve higher speeds, a transmitter transmits the data signal without an accompanying clock signal. The receiver is equipped with a clock data recovery (CDR) circuit. The CDR circuit is employed to sample an incoming data signal, extract the clock from the incoming data signal, and retime the sampled data. The clock generated by the CDR circuit is synchronized with the data signal. There may be various CDR circuits such as phase-locked loop (PLL) based CDR circuits, delay-locked loop (DLL) based CDR circuit and phase interpolator (PI) based CDR circuits.

In a PI based CDR circuit, multi-phase clock signals (e.g., 4-phase clock signal) are used to perform phase interpolation for data signals. multi-phase clock signals are also widely used in other data communication applications. For example, in a time-interleaved analog-to-digital conversion (ADC) system on a receiver, multi-phase clock signals are used to sample the input data.

Many techniques have been employed to generate multi-phase clock signals. One possible technique is to make a ring oscillator and tap its nodes. A voltage controlled or current controlled differential ring oscillator having multiple stages of delayed differential inverted amplifiers connected in a ring form is used to generate multiphase clock signals.

In higher frequency data communication applications, a time space shift or deviation between two clock signals is referred to as a skew. The skew of the clock signal can produce errors in the analog to digital conversion process, as well as reduce system performance. As the clock rate of the data communication system increases, timing becomes more critical. It would be desirable to have a simple and reliable calibration method to reduce the skews of the multi-phase clock signals.

SUMMARY

These and other problems are generally solved or circumvented, and technical advantages are generally achieved, by preferred embodiments of the present disclosure which provide a clock signal skew calibration apparatus for reducing clock skews of 4-phase clock signals.

In accordance with an embodiment, an apparatus comprises a clock skew calibration circuit configured to be coupled to a multi-phase clock generator through a plurality of delay lines, wherein a first clock skew calibration unit of the clock skew calibration circuit comprises a frequency doubler configured to receive a plurality of multi-phase clock signals and generate a clock signal based on the plurality of multi-phase clock signals, a frequency divider configured to receive the clock signal and generate a reduced frequency signal based on the clock signal, the reduced frequency signal having a duty cycle indicating a skew of a first multi-phase clock signal, and a delay line control circuit configured to compare the duty cycle of the reduced frequency signal with a predetermined duty cycle, and generate a first control signal to adjust the skew of the first multi-phase clock signal through adjusting a first delay applied to the first multi-phase clock signal until a calibrated signal of the first multi-phase clock signal is achieved.

In accordance with another embodiment, a method comprises generating, by a frequency doubler, a clock signal based on a plurality of multi-phase clock signals, generating, by a frequency divider, a reduced frequency signal based on the clock signal, the reduced frequency signal having a duty cycle indicating a skew of a first multi-phase clock signal, comparing the duty cycle of the reduced frequency signal with a predetermined duty cycle, and generating, by a delay line control circuit, a first control signal to adjust the skew of the first multi-phase clock signal through adjusting a first delay applied to the first multi-phase clock signal until a calibrated signal of the first multi-phase clock signal is achieved.

In accordance with yet another embodiment, a system comprises a multi-phase clock generator configured to generate a plurality of multi-phase clock signals, a plurality of delay lines configured to receive respective multi-phase clock signals, and a clock skew calibration circuit configured to be coupled to the multi-phase clock generator through the plurality of delay lines, wherein of the clock skew calibration circuit comprises a first clock skew calibration unit, a second clock skew calibration unit and a third clock skew calibration unit, and wherein the first clock skew calibration unit comprises a frequency doubler configured to receive the plurality of multi-phase clock signals and generate a clock signal based on the plurality of multi-phase clock signals, a frequency divider configured to receive the clock signal and generate a reduced frequency signal based on the clock signal, the reduced frequency signal having a duty cycle indicating a skew of a first multi-phase clock signal, and a delay line control circuit configured to compare the duty cycle of the reduced frequency signal with a predetermined duty cycle, and generate a first control signal to adjust a first delay applied to the first multi-phase clock signal until a calibrated signal of the first multi-phase clock signal is achieved.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a clock signal skew calibration apparatus for reducing clock skews of 4-phase clock signals. The disclosure may also be applied, however, to a clock signal skew calibration apparatus for reducing clock skews of multi-phase clock signals. Hereinafter, various embodiments will be explained in detail with reference to the accompanying drawings.

Figure 1:
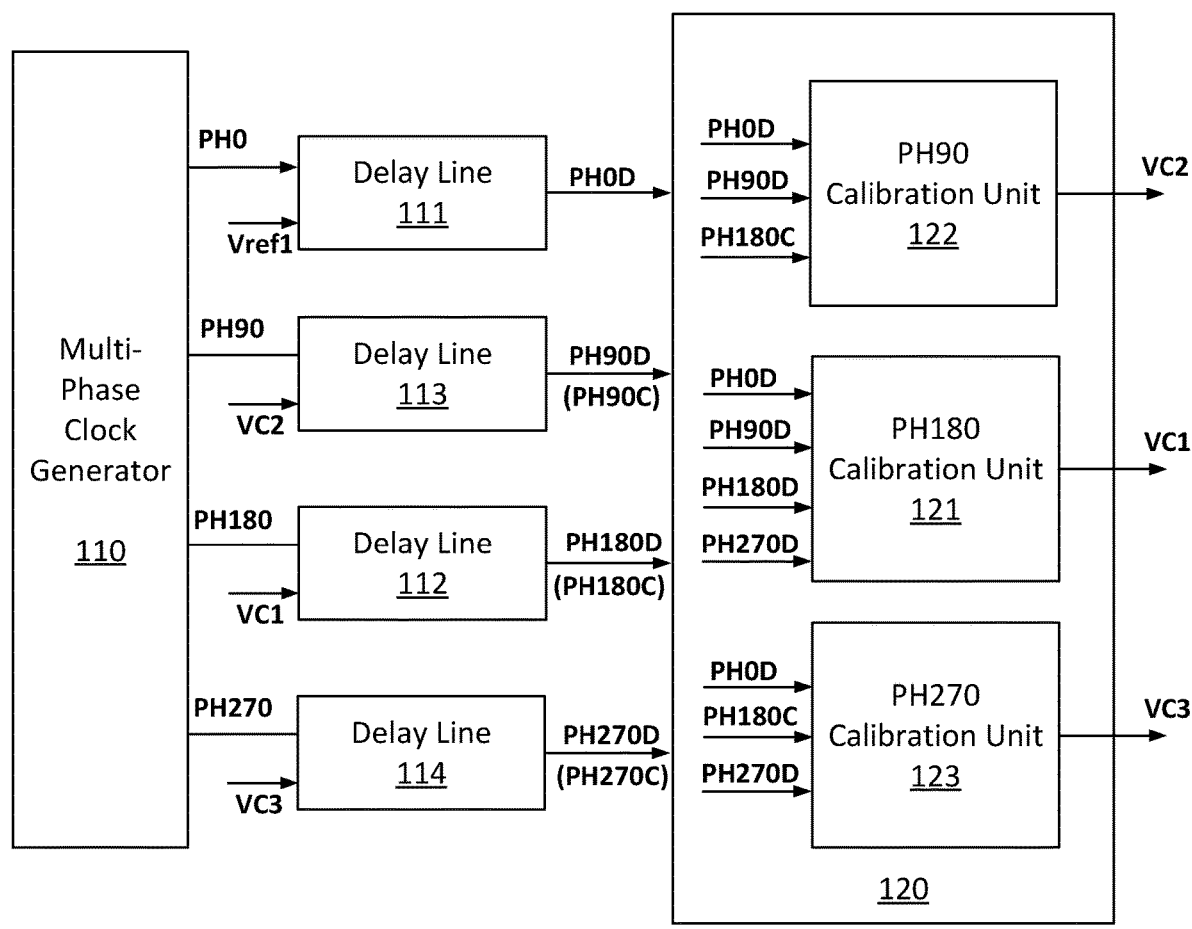
FIG. 1 illustrates a block diagram of a clock signal skew calibration circuit in accordance with various embodiments of the present disclosure.

FIG. 1 illustrates a block diagram of a clock signal skew calibration circuit in accordance with various embodiments of the present disclosure. As shown in FIG. 1, the clock skew calibration circuit 120 is configured to be coupled to a multi-phase clock generator 110 through a plurality of delay lines 111, 112, 113 and 114.

The multi-phase clock generator 110 is configured to generate a plurality of multi-phase clock signals. In some embodiments, the multi-phase clock generator 110 is configured to generate 4-phase clock signals, namely a 0-degree clock signal PHO, a 90-degree clock signal PH90, a 180-degree clock signal PH180 and a 270-degree clock signal PH270 as shown in FIG. 1. PHO, PH90, PH180 and PH270 generated by the multi-phase clock generator 110 are four-phase clock signals having their phases mutually separated by 90 degrees respectively.

In some embodiments, PHO, PH90, PH180 and PH270 are 4-phase clock signals having a frequency of 5 GHz. The 4-phase clock signals PHO, PH90, PH180 and PH270 are used for 20 Gbps (billions of bits per second) data-transfer applications. The detailed implementation of the multi-phase clock generator 110 will be described below with respect to FIG. 2.

As shown in FIG. 1, a first delay line 111 is configured to receive the 0-degree clock signal PHO and a predetermined reference signal Vref1. Based on the predetermined reference signal Vref1, the first delay line 111 adds a predetermined delay into the 0-degree clock signal. As shown in FIG. 1, PH0D is generated by the first delay line 111.

In some embodiments, the 0-degree clock signal PH0D is a reference clock signal of the 4-phase clock signals. As such, in the skew calibration process, the delay added into PHO is not adjusted. The skews of other clock signals (e.g., the 180-degree clock signal) are determined with reference to the reference clock signal PH0D. The skews of other clock signals can be reduced through adjusting the delays added into respective clock signals.

As shown in FIG. 1, a second delay line 112 is configured to receive the 180-degree clock signal PH180 and a first control signal VC1. VC1 is generated by the clock skew calibration circuit 120. VC1 is used to determine the delay added into the 180-degree clock signal PH180. Through adjusting the delay added into the 180-degree clock signal, the skew of the 180-degree clock signal is reduced accordingly. As shown in FIG. 1, the second delay line 112 receives PH180 and generates PH180D through adding an initial delay. Both PH180 and PH180D are the 180-degree clock signals having a delay between them. During the calibration process of the 180-degree clock signal, the initial delay is adjusted to become a first delay determined by the first control signal VC1. Once the initial delay has been changed to the first delay, PH180C is generated at the output of the second delay line 112. PH180C is a calibrated 180-degree clock signal. In other words, the phase difference between the reference clock signal PH0D and PH180C is 180 degrees.

As shown in FIG. 1, a third delay line 113 is configured to receive the 90-degree clock signal PH90 and a second control signal VC2. VC2 is generated by the clock skew calibration circuit 120. VC2 is used to determine the delay added into the 90-degree clock signal PH90. Through adjusting the delay added into the 90-degree clock signal, the skew of the 90-degree clock signal is reduced accordingly. As shown in FIG. 1, the third delay line 113 receives PH90 and generates PH90D through adding an initial delay. Both PH90 and PH90D are the 90-degree clock signals having a delay between them. During the calibration process of the 90-degree clock signal, the initial delay is adjusted to become a second delay determined by the second control signal VC2. Once the initial delay has been changed to the second delay, PH90C is generated at the output of the third delay line 113. PH90C is a calibrated 90-degree clock signal. In other words, the phase difference between the reference clock signal PH0D and PH90C is 90 degrees.

As shown in FIG. 1, a fourth delay line 114 is configured to receive the 270-degree clock signal PH270 and a third control signal VC3. VC3 is generated by the clock skew calibration circuit 120. VC3 is used to determine the delay added into the 270-degree clock signal PH270. Through adjusting the delay added into the 270-degree clock signal, the skew of the 270-degree clock signal is reduced accordingly. As shown in FIG. 1, the fourth delay line 114 receives PH270 and generates PH270D through adding an initial delay. Both PH270 and PH270D are the 270-degree clock signals having a delay between them. During the calibration process of the 270-degree clock signal, the initial delay is adjusted to become a third delay determined by the third control signal VC3. Once the initial delay has been changed to the third delay, PH270C is generated at the output of the fourth delay line 114. PH270C is a calibrated 270-degree clock signal. In other words, the phase difference between the reference clock signal PH0D and PH270C is 270 degrees.

The clock skew calibration circuit 120 comprises a PH180 calibration unit 121, a PH90 calibration unit 122 and a PH270 calibration unit 123. Throughout the description, the PH180 calibration unit 121 is alternatively referred to as a first clock skew calibration unit 121. The PH90 calibration unit 122 is alternatively referred to as a second clock skew calibration unit 122. The PH270 calibration unit 123 is alternatively referred to as a third clock skew calibration unit 123.

In some embodiments, the first clock skew calibration unit 121 comprises a frequency doubler, a frequency divider and a delay line control circuit. The detailed structure of the first clock skew calibration unit 121 will be described below with respect to FIG. 4.

In operation, the first clock skew calibration unit 121 and the second delay line 112 form a closed loop control system. This closed loop control system determines the first control signal VC1 based on the skew of the 180-degree clock signal, and adjust the delay added into the 180-degree clock signal to reduce or eliminate the skew of the 180-degree clock signal. As a result, the skew of the 180-degree clock signal is calibrated.

In operation, the first clock skew calibration unit 121 is configured to receive a plurality of multi-phase clock signals including PH0D, PH90D, PH180D and PH270D as shown in FIG. 1. Based on the plurality of multi-phase clock signals PH0D, PH90D, PH180D and PH270D, the frequency doubler generates a clock signal. The frequency divider is configured to receive the clock signal and generate a reduced frequency signal based on the clock signal. The reduced frequency signal having a duty cycle indicating a skew of a first multi-phase clock signal (e.g., the 180-degree clock signal). The delay line control circuit is configured to compare the duty cycle of the reduced frequency signal with a predetermined duty cycle, and generate the first control signal VC1. The first control signal VC1 is employed to adjust a first delay applied to the first multi-phase clock signal (e.g., the 180-degree clock signal) until a calibrated signal of the first multi-phase clock signal is achieved. Once the skew calibration process finishes, PH180C generated by the second delay line 112 is the calibrated signal of the 180-degree clock signal.

In some embodiments, the second clock skew calibration unit 122 comprises a first logic gate, a second logic gate and a first comparator. The detailed structure of the second clock skew calibration unit 122 will be described below with respect to FIG. 10.

In operation, the second clock skew calibration unit 122 and the third delay line 113 form a closed loop control system. This closed loop control system determines the second control signal VC2 based on the skew of the 90-degree clock signal, and adjust the delay added into the 90-degree clock signal to reduce or eliminate the skew of the 90-degree clock signal. As a result, the skew of the 90-degree clock signal is calibrated.

In operation, the second clock skew calibration unit 122 is configured to receive PH0D, PH90D and PH180C. In some embodiments, PH0D is a reference multi-phase clock signal. PH180C is the calibrated signal of the first multi-phase clock signal. PH90D is a second multi-phase clock signal.

The first logic gate is configured to perform a first AND operation on the calibrated signal of the first multi-phase clock signal (PH180C) and the second multi-phase clock signal (PH90D). The second logic gate configured to perform a second AND operation on the reference multi-phase clock signal (PH0D) and the second multi-phase clock signal (PH90D). The first comparator is configured to compare an output of the first logic gate with an output of the second logic gate, and generate the second control signal VC2. The second control signal VC2 is employed to adjust a second delay applied to the second multi-phase clock signal (the 90-degree clock signal) until a calibrated signal of the second multi-phase clock signal is achieved. Once the skew calibration process finishes, PH90C generated by the third delay line 113 is the calibrated signal of the 90-degree clock signal.

In some embodiments, the third clock skew calibration unit 123 comprises a third logic gate, a fourth logic gate and a second comparator. The detailed structure of the second clock skew calibration unit 123 will be described below with respect to FIG. 12.

In operation, the third clock skew calibration unit 123 and the fourth delay line 114 form a closed loop control system. This closed loop control system determines the third control signal VC3 based on the skew of the 270-degree clock signal, and adjust the delay added into the 270-degree clock signal to reduce or eliminate the skew of the 270-degree clock signal. As a result, the skew of the 270-degree clock signal is calibrated.

In operation, the third clock skew calibration unit 123 is configured to receive PH0D, PH180C and PH270D. In some embodiments, PH0D is a reference multi-phase clock signal. PH180C is the calibrated signal of the first multi-phase clock signal. PH270D is a third multi-phase clock signal.

The third logic gate is configured to perform a third AND operation on the calibrated signal of the first multi-phase clock signal (PH180C) and the third multi-phase clock signal (PH270D). The fourth logic gate configured to perform a fourth AND operation on the reference multi-phase clock signal (PH0D) and the third multi-phase clock signal (PH270D). The second comparator is configured to compare an output of the first logic gate with an output of the second logic gate, and generate the third control signal VC3. The third control signal VC3 is employed to adjust a third delay applied to the third multi-phase clock signal (the 270-degree clock signal) until a calibrated signal of the third multi-phase clock signal is achieved. Once the skew calibration process finishes, PH270C generated by the fourth delay line 114 is the calibrated signal of the 270-degree clock signal.

Figure 2:
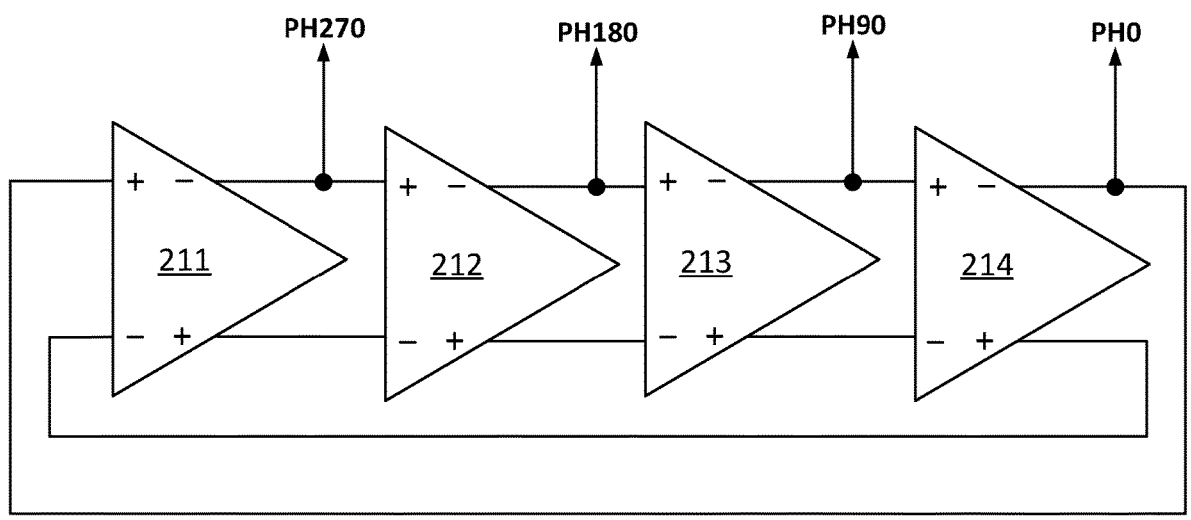
FIG. 2 illustrates a schematic diagram of the multi-phase clock generator shown in FIG. 1 in accordance with various embodiments of the present disclosure.

FIG. 2 illustrates a schematic diagram of the multi-phase clock generator shown in FIG. 1 in accordance with various embodiments of the present disclosure. In some embodiments, the multi-phase clock generator 110 is implemented as a 4-phase clock generator as shown in FIG. 2. The multi-phase clock generator 110 comprises a first oscillator 211, a second oscillator 212, a third oscillator 213 and a fourth oscillator 214 connected in cascade.

As shown in FIG. 2, an inverting output of the first oscillator 211 is connected to a non-inverting input of the second oscillator 212. The inverting output of the first oscillator 211 is configured to generate the 270-degree clock signal PH270. A non-inverting output of the first oscillator 211 is connected to an inverting input of the second oscillator 212. An inverting output of the second oscillator 212 is connected to a non-inverting input of the third oscillator 213. The inverting output of the second oscillator 212 is configured to generate the 180-degree clock signal PH180. A non-inverting output of the second oscillator 212 is connected to an inverting input of the third oscillator 213.

An inverting output of the third oscillator 213 is connected to a non-inverting input of the fourth oscillator 214. The inverting output of the third oscillator 213 is configured to generate the 90-degree clock signal PH90. A non-inverting output of the third oscillator 213 is connected to an inverting input of the fourth oscillator 214. An inverting output of the fourth oscillator 214 is connected to a non-inverting input of the first oscillator 211. The inverting output of the fourth oscillator 214 is configured to generate the 0-degree clock signal PH0. A non-inverting output of the fourth oscillator 214 is connected to an inverting input of the first oscillator 211.

The operating principle of the 4-phase clock generator shown in FIG. 2 is well known in the art, and hence is not discussed herein to avoid repetition.

Figure 3:
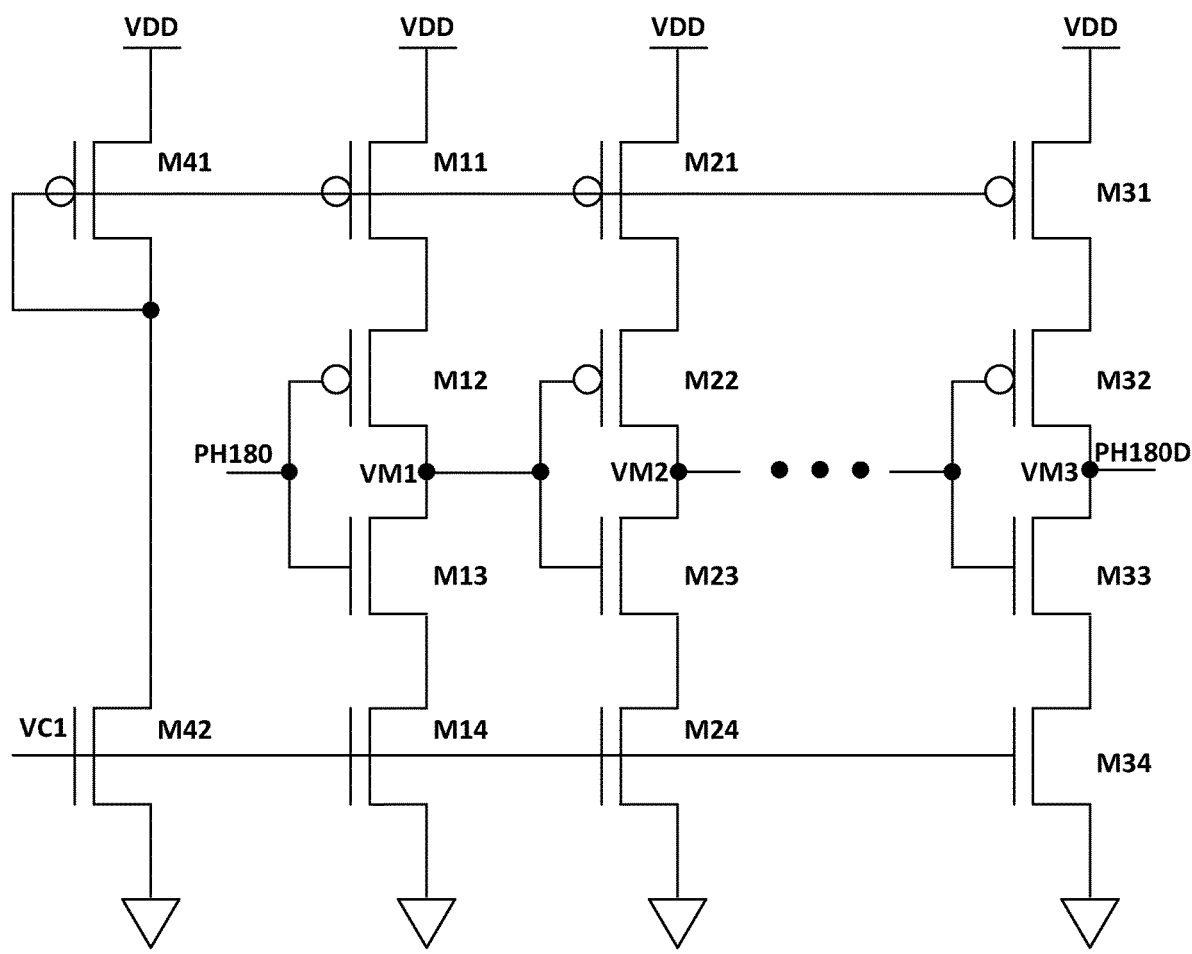
FIG. 3 illustrates a schematic diagram of the delay line shown in FIG. 1 in accordance with various embodiments of the present disclosure.

FIG. 3 illustrates a schematic diagram of the delay line shown in FIG. 1 in accordance with various embodiments of the present disclosure. The four delay lines shown in FIG. 1 may have the same structure. The second delay line 112 is used as an example to illustrate the structure and operating principles of the delay lines shown in FIG. 1.

The second delay line 112 comprises a biasing circuit and a plurality of inverting legs. The biasing circuit comprising an upper transistor M41 and a lower transistor M42 connected in series between a supply voltage VDD and ground. The plurality of inverting legs is connected in parallel between the supply voltage VDD and ground. Each inverting leg comprises a first transistor, a second transistor, a third transistor and a fourth transistor connected in series. As shown in FIG. 2, a first inverting leg of the plurality of inverting legs comprises transistors M11, M12, M13, M14 connected in series between VDD and ground. A second inverting leg of the plurality of inverting legs comprises transistors M21, M22, M23, M24 connected in series between VDD and ground. A last inverting leg of the plurality of inverting legs comprises transistors M31, M32, M33, M34 connected in series between VDD and ground. In some embodiments, M11, M12, M21, M22, M31, M32 and M41 are p-type transistors. M13, M14, M23, M24, M33, M34 and M42 are n-type transistors.

As shown in FIG. 3, gates of transistors M11, M21 and M31 are connected to a gate of the upper transistor M41. In the first inverting leg, a gate of M12 and a gate of M13 are connected together and function as an input of the first inverting leg. A midpoint VM1 of the first inverting leg functions as an output of the first inverting leg. In the second inverting leg, a gate of M22 and a gate of M23 are connected together and function as an input of the second inverting leg. A midpoint VM2 of the second inverting leg functions as an output of the second inverting leg. In the last inverting leg, a gate of M32 and a gate of M33 are connected together and function as an input of the last inverting leg. A midpoint VM3 of the last inverting leg functions as an output of the last inverting leg. Gates of transistors M14, M24 and M34 are connected to a gate of the lower transistor M42.

As shown in FIG. 3, an input of the first inverting leg is configured to receive the first multi-phase clock signal PH180. An output of the first inverting leg is connected to an input of the second inverting leg. An output of the second inverting leg is connected to an input of an adjacent inverting leg (not shown). An input of the last inverting leg is connected to an output of an adjacent inverting leg (not shown). An output of the last inverting leg is configured to generate PH180D as shown in FIG. 3. Once the calibration process of the first multi-phase clock signal PH180 finishes, the output of the last inverting leg is configured to generate the calibrated signal of the first multi-phase clock signal (PH180C).

In operation, each inverting leg functions as a current-starved inverter. The second delay line 112 is configured to receive the first control signal VC1 at the gate of M42. The current-starved inverters are able to convert the first control signal VC1 into a voltage-controlled delay. In each inverting leg, the uppermost transistor (e.g., M11) and the lowermost transistor (e.g., M14) function as current sources. Two middle transistors (e.g., M12 and M13) function as an inverter. In response to the first control signal VC1, the current sources (e.g., M11 and M14) are able to control the current supplied to the inverters (e.g., M12 and M13). In particular, the currents supplied to the inverters are determined by the biasing circuit formed by M41 and M42. The current through M42 is proportional to the gate-to-source voltage of M42 (VC1). Therefore, the greatest current results in the shortest delay. As such, when VC1 is increased, the delay is reduced. On the other hand, the smaller the current, the greater the delay. As such, when VC1 is decreased, the delay is increased. The second delay line 112 is able to add an adjustable delay into PH180 in response to VC1. Once an appropriate delay has been added into PH180, the second delay line 112 generates PH180C. PH180C is a calibrated signal of PH180.

Figure 4:
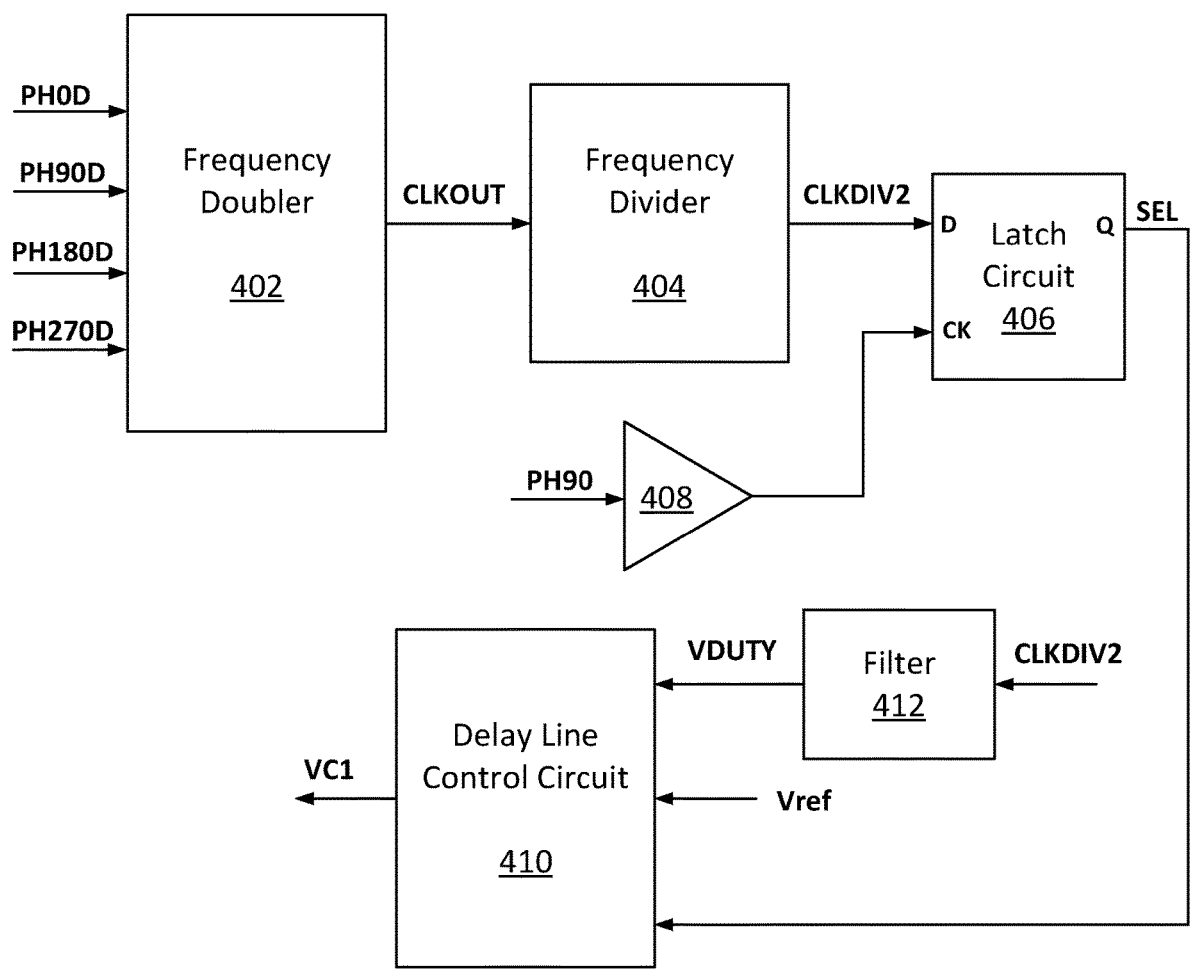
FIG. 4 illustrates a block diagram of the first clock skew calibration unit shown in FIG. 1 in accordance with various embodiments of the present disclosure.

FIG. 4 illustrates a block diagram of the first clock skew calibration unit shown in FIG. 1 in accordance with various embodiments of the present disclosure. The first clock skew calibration unit 121 comprises a frequency doubler 402, a frequency divider 404, a latch circuit 406, a buffer 408, a delay line control circuit 410 and a filter 412.

As shown in FIG. 4, the frequency doubler 402 is configured to receive a plurality of multi-phase clock signals PH0D, PH90D, PH180D and PH270D. Based on the plurality of multi-phase clock signals, the frequency doubler 402 generates a clock signal CLKOUT. The frequency divider 404 is configured to receive the clock signal CLKOUT and generate a reduced frequency signal CLKDIV2 based on the clock signal CLKOUT. The frequency of CLKDIV2 is one half of the frequency of CLKOUT. The reduced frequency signal CLKDIV2 has a duty cycle indicating a skew of a first multi-phase clock signal PH180D.

The reduced frequency signal CLKDIV2 is fed into the date input of the latch circuit 406. The 90-degree clock signal PH90 is fed into the clock input of the latch circuit 406 through the buffer 408. The latch circuit 406 is configured to generate a direction control signal SEL.

The filter 412 is configured to receive the reduced frequency signal CLKDIV2, and generate a dc signal VDUTY. The voltage of VDUTY is proportional to the duty cycle of the reduced frequency signal CLKDIV2.

The delay line control circuit 410 is configured to receive VDUTY, SEL and a predetermined reference voltage Vref. The delay line control circuit 410 is configured to compare the duty cycle of the reduced frequency signal CLKDIV2 with a predetermined duty cycle. In some embodiments, VDUTY represents the duty cycle of the reduced frequency signal CLKDIV2. Vref represents the predetermined duty cycle. In some embodiments, the predetermined duty cycle is equal to 50%.

In operation, based on VDUTY, Vref and SEL, the delay line control circuit 410 generates the first control signal VC1 to adjust the skew of the first multi-phase clock signal PH180 through adjusting a first delay applied to the first multi-phase clock signal PH180 until a calibrated signal of the first multi-phase clock signal is achieved.

Figure 5:
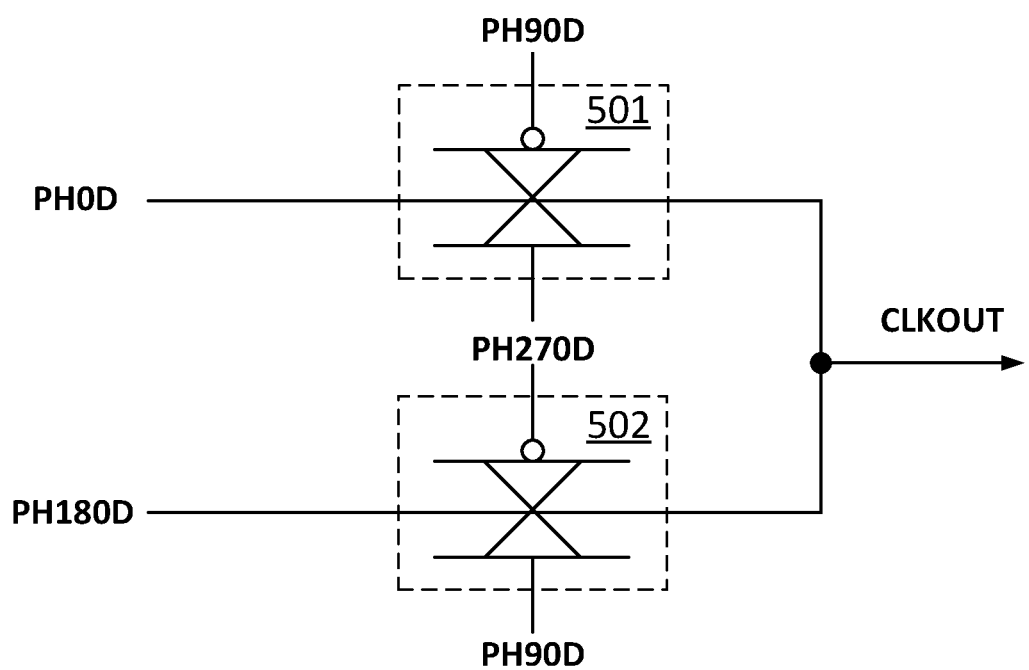
FIG. 5 illustrates a schematic diagram of the frequency doubler shown in FIG. 4 in accordance with various embodiments of the present disclosure.

FIG. 5 illustrates a schematic diagram of the frequency doubler shown in FIG. 4 in accordance with various embodiments of the present disclosure. The frequency doubler 402 comprises a first transmission gate 501 and a second transmission gate 502. The frequency doubler 402 is configured to receive PH0D, PH90D, PH180D and PH270D, and generate the clock signal CLKOUT.

An input of the first transmission gate 501 is configured to receive the 0-degree clock signal PH0D. An output of the first transmission gate 501 is connected to an output of the frequency doubler 402. A first control terminal of the first transmission gate 501 is configured to receive the 90-degree clock signal PH90D. A second control terminal of the first transmission gate 501 is configured to receive the 270-degree clock signal PH270D.

An input of the second transmission gate 502 is configured to receive the 180-degree clock signal PH180D. An output of the second transmission gate 502 is connected to the output of the frequency doubler 402. A first control terminal of the second transmission gate 502 is configured to receive the 270-degree clock signal PH270D. A second control terminal of the second transmission gate 502 is configured to receive the 90-degree clock signal PH90D.

The operating principle of the frequency doubler shown in FIG. 5 is well known in the art, and hence is not discussed herein to avoid repetition.

Figure 6:
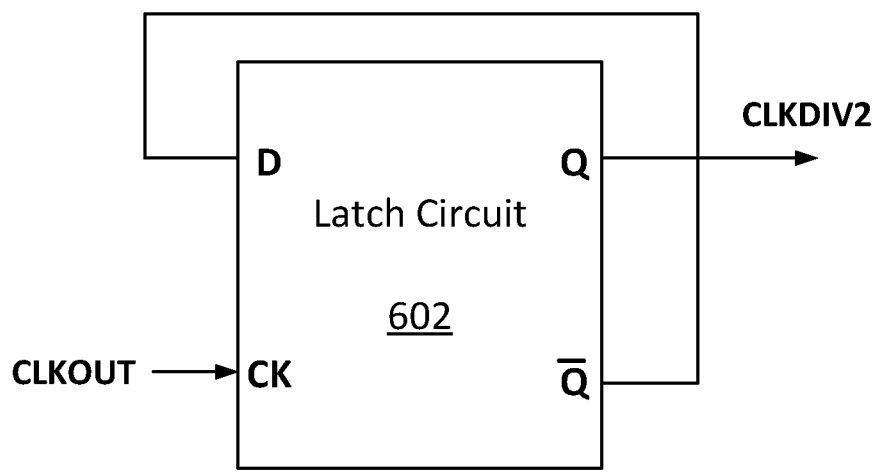
FIG. 6 illustrates a schematic diagram of the frequency divider shown in FIG. 4 in accordance with various embodiments of the present disclosure.

FIG. 6 illustrates a schematic diagram of the frequency divider shown in FIG. 4 in accordance with various embodiments of the present disclosure. The frequency divider 404 is implemented as a latch circuit 602. The clock signal CLKOUT is fed into the clock input of the latch circuit 602. The date input and the Q-bar output of the latch circuit 602 are connected together. The Q output of the latch circuit 602 is configured to generate the reduced frequency signal CLKDIV2.

The operating principle of the frequency divider shown in FIG. 6 is well known in the art, and hence is not discussed herein to avoid repetition.

Figure 7:
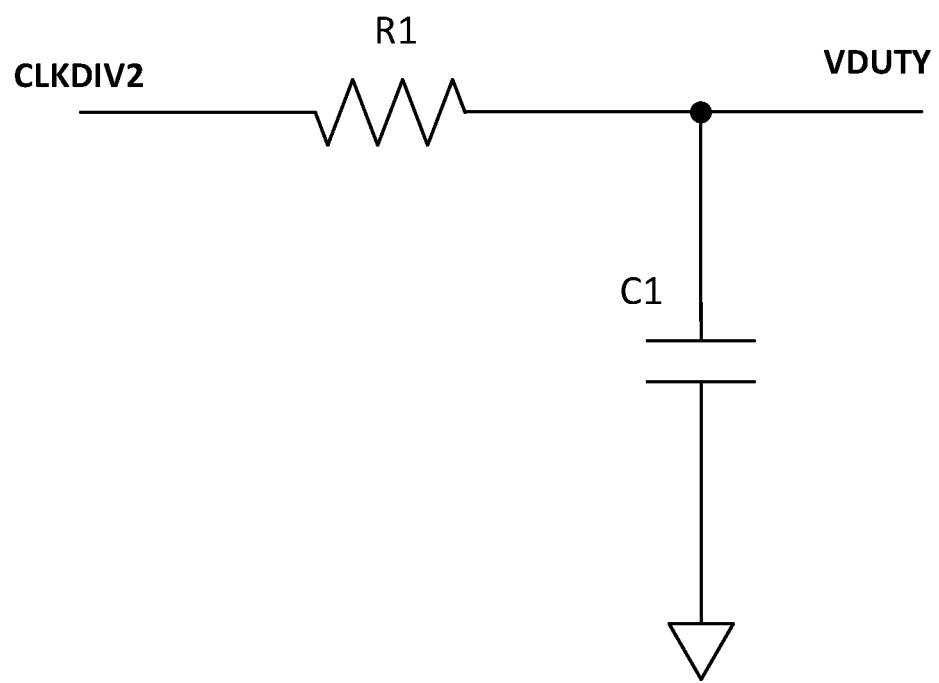
FIG. 7 illustrates a schematic diagram of the filter shown in FIG. 4 in accordance with various embodiments of the present disclosure.

FIG. 7 illustrates a schematic diagram of the filter shown in FIG. 4 in accordance with various embodiments of the present disclosure. The filter 412 comprises a resistor R1 and a capacitor C1. One terminal of R1 is the input of the filter 412. A common node of R1 and C1 is the output of the filter 412. The filter 412 is a low-pass filter configured to convert the reduced frequency signal CLKDIV2 into a dc signal VDUTY. The voltage of the dc signal VDUTY is proportional to the duty cycle of the reduced frequency signal CLKDIV2.

Figure 8:
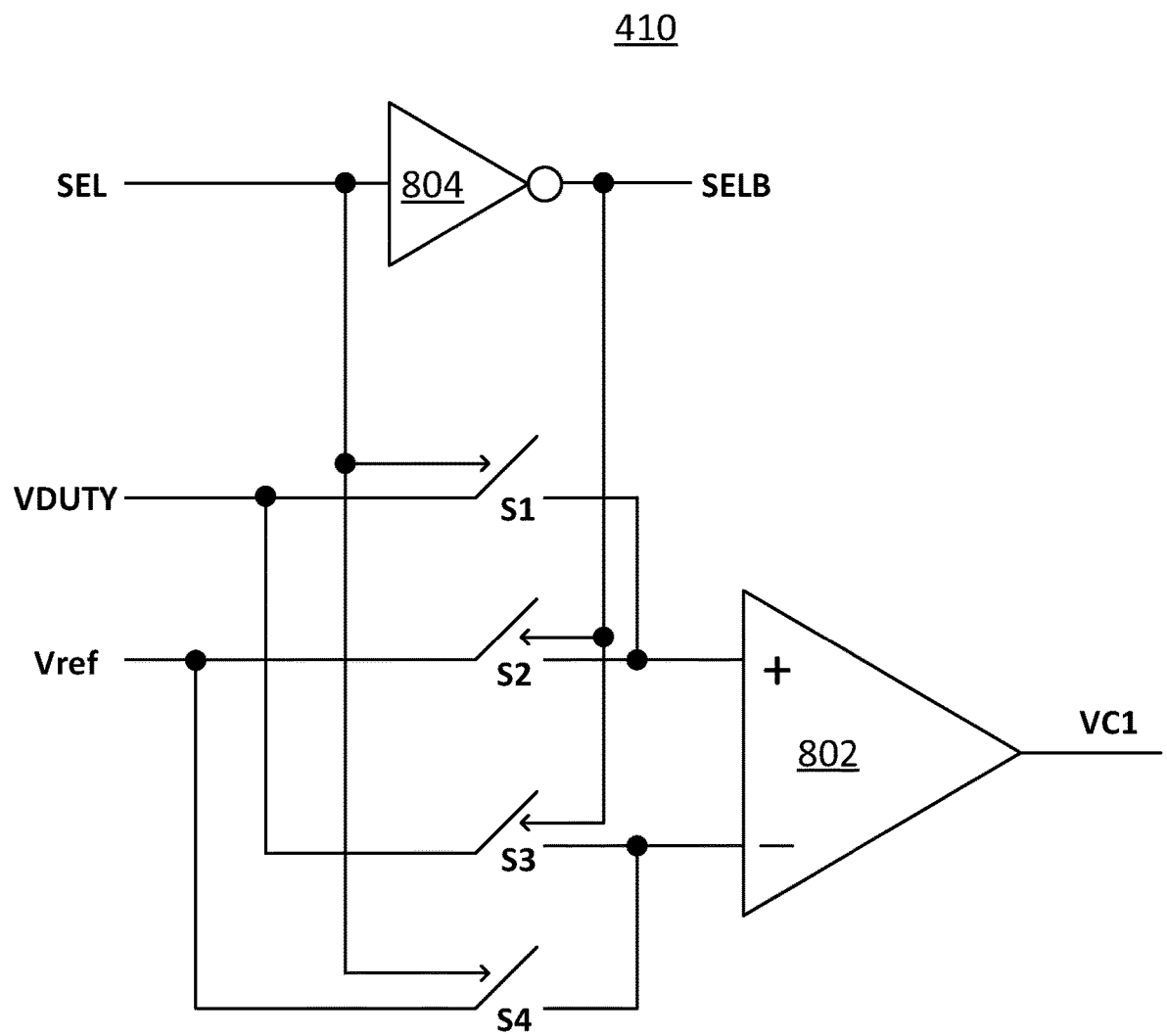
FIG. 8 illustrates a schematic diagram of the delay line control circuit shown in FIG. 4 in accordance with various embodiments of the present disclosure.

FIG. 8 illustrates a schematic diagram of the delay line control circuit shown in FIG. 4 in accordance with various embodiments of the present disclosure. The delay line control circuit 410 comprises an inverter 804, a first switch S1, a second switch S2, a third switch S3, a fourth switch S4 and a comparator 802.

As shown in FIG. 8, the inverter 804 is configured to receive the direction control signal SEL, and generate an inverted signal SELB of the direction control signal SEL. A first drain/source terminal of the first switch S1 is configured to receive the dc signal VDUTY. A second drain/source terminal of the first switch S1 is connected to a non-inverting input of the comparator 802. A gate of the first switch S1 is controlled by the direction control signal SEL.

A first drain/source terminal of the second switch S2 is configured to receive the reference voltage Vref. A second drain/source terminal of the second switch S2 is connected to the non-inverting input of the comparator 802. A gate of the second switch S2 is controlled by the inverted signal SELB of the direction control signal SEL.

A first drain/source terminal of the third switch S3 is configured to receive the dc signal VDUTY. A second drain/source terminal of the third switch S3 is connected to an inverting input of the comparator 802. A gate of the third switch S3 is controlled by the inverted signal SELB of the direction control signal SEL.

A first drain/source terminal of the fourth switch S4 is configured to receive the reference voltage Vref. A second drain/source terminal of the fourth switch S4 is connected to the inverting input of the comparator 802. A gate of the fourth switch S4 is controlled by the direction control signal SEL.

In operation, SEL and SELB control the on and off of switches S1, S2, S3 and S4. When SEL is of a logic high state, VDUTY is fed into the non-inverting input of the comparator 802, and Vref is fed into the inverting input of the comparator 802. On the other hand, When SEL is of a logic low state, VDUTY is fed into the inverting input of the comparator 802, and Vref is fed into the non-inverting input of the comparator 802. The output of the comparator 802 is configured to generate the first control signal VC1.

Figure 9:
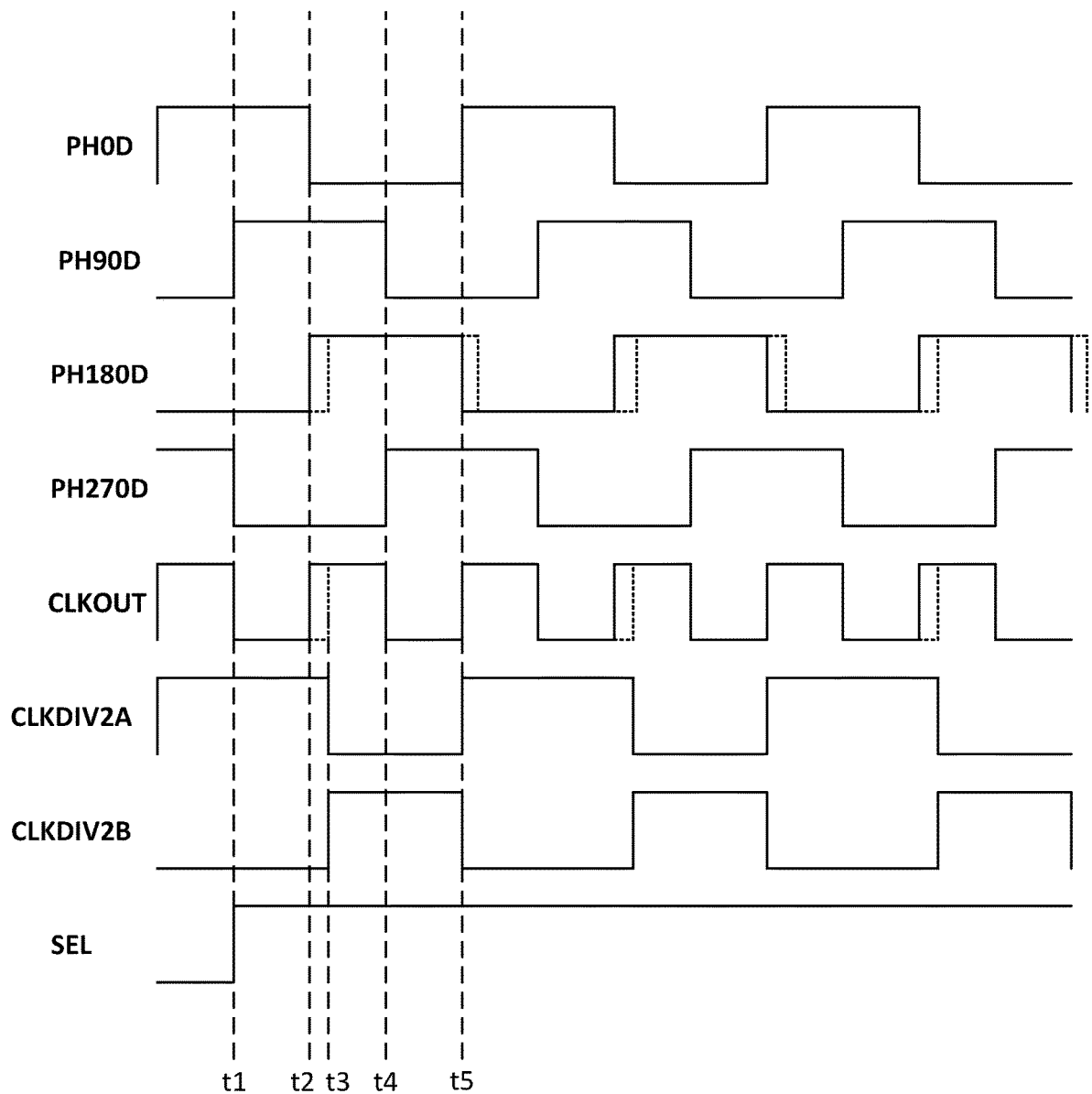
FIG. 9 illustrates various waveforms associated with of the first clock skew calibration unit in accordance with various embodiments of the present disclosure.

FIG. 9 illustrates various waveforms associated with of the first clock skew calibration unit in accordance with various embodiments of the present disclosure. The horizontal axis of FIG. 9 represents intervals of time. There may be eight rows in FIG. 9. The first row represents PH0D. The second row represents PH90D. The third row represents PH180D. The fourth row represents PH270D. The fifth row represents the clock signal CLKOUT. The sixth row represents a first reduced frequency signal CLKDIV2A. The seventh row represents a second reduced frequency signal CLKDIV2B. The eighth row represents the direction control signal SEL.

Referring back to FIG. 1, the multi-phase clock generator 110 is configured to generate PHO, PH90, PH180 and PH270. After PHO, PH90, PH180 and PH270 pass through respective delay lines, PH0D, PH90D, PH180D and PH270D are generated and fed into the clock signal skew calibration circuit. In some embodiments, there is a skew at PH180D. This skew is indicated by the dashed line between t2 and t3.

The clock signal CLKOUT is generated based on PH0D, PH90D, PH180D and PH270D. As shown in FIG. 9, at t1, in response to the leading edge of PH90D and the falling edge of PH270D, CLKOUT changes from a logic high state to a logic low state. At t3, in response to the leading edge (dashed line) of PH180D, CLKOUT changes from a logic low state to a logic high state (dashed line). At t4, in response to the leading edge of PH270 and the falling edge of PH90D, CLKOUT changes from a logic high state to a logic low state. At t5, in response to the leading edge of PH0D, CLKOUT changes from a logic low state to a logic high state.

There are two reduced frequency signals CLKDIV2A and CLKDIV2B. As shown in FIG. 9, the rising edge of CLKDIV2A is aligned with the rising edge of PH0. The rising edge of CLKDIV2B is aligned with the rising edge of PH180D. When PH180D lags, the duty cycle of CLKDIV2A is greater than 50%, and the duty cycle of CLKDIV2B is less than 50%. As such, the skew calibration process has two opposite directions.

Referring back to FIG. 8, when the rising edge of the reduced frequency signal is aligned with the rising edge of PH0, SEL has a logic high state. When the rising edge of the reduced frequency signal is aligned with the rising edge of PH180, SEL has a logic low state. When SEL has a logic high state and PH180D lags, the duty cycle of the reduced frequency signal is greater than 50%. When SEL has a logic low state and PH180D lags, the duty cycle of the reduced frequency signal is less than 50%.

Referring back to FIG. 8, when SEL has a logic high state, VDUTY is connected to the non-inverting input of the comparator 802 and Vref is connected to the inverting input of the comparator 802. Since the duty cycle of the reduced frequency signal is greater than 50%, VDUTY is greater than Vref. VC1 increases. Referring back to FIG. 3, the increased VC1 reduces the delay added into PH180. As a result, the skew of PH180 is reduced. When SEL has a logic low state, VDUTY is connected to the inverting input of the comparator 802 and Vref is connected to the non-inverting input of the comparator 802. Since the duty cycle of the reduced frequency signal is less than 50%, VDUTY is less than Vref. VC1 increases. Referring back to FIG. 3, the increased VC1 reduces the delay added into PH180. As a result, the skew of PH180 is reduced.

In operation, the skew calibration process has two opposite directions. The direction of the skew calibration process can be determined through sampling the reduced frequency signal using PH90D. For example, PH90D is used to sample CLKDIV2A, and the result is a logic high state. This logic high state indicates that the rising edge of CLKDIV2A is aligned with PH0D. The duty cycle of CLKDIV2A is greater than 50%. After knowing this direction of the skew calibration process, the delay line control circuit is able to reduce the delay added into PH180D so as to make the duty cycle of CLKDIV2A equal to 50%. Once the duty cycle of CLKDIV2A is equal to 50%, the corresponding delay is an appropriate delay added into PH180. Under this appropriate delay, the output PH180C is the calibrated signal of PH180.

One advantageous feature of the skew calibration control scheme shown in FIG. 9 is that through adjusting the delay added into PH180, the duty cycle of the reduced frequency signal (e.g., CLKDIV2A) is set at 50%. Once the duty cycle of the reduced frequency signal (e.g., CLKDIV2A) is set at 50%, the phase difference between PH0D and PH180C is equal to 180 degrees.

Figure 10:
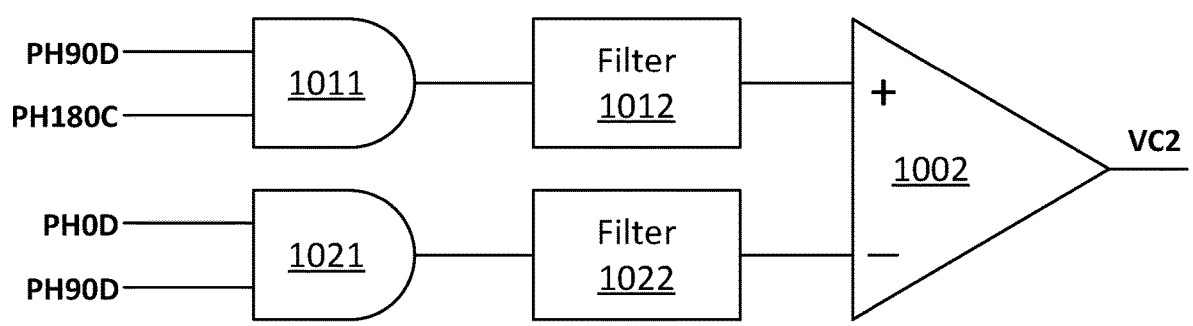
FIG. 10 illustrates a schematic diagram of the second clock skew calibration unit shown in FIG. 1 in accordance with various embodiments of the present disclosure.

FIG. 10 illustrates a schematic diagram of the second clock skew calibration unit shown in FIG. 1 in accordance with various embodiments of the present disclosure. The second clock skew calibration unit 122 comprises a first logic gate 1011, a second logic gate 1021, a first filter 1012, a second filter 1022 and a first comparator 1002. The first logic gate 1011 and the second logic gate 1021 are implemented as AND gates.

The first logic gate 1011 is configured to perform a first AND operation on the calibrated signal of the first multi-phase clock signal and a second multi-phase clock signal. As shown in FIG. 10, the calibrated signal of the first multi-phase clock signal is PH180C. The second multi-phase clock signal is PH90D.

The second logic gate 1021 is configured to perform a second AND operation on a reference multi-phase clock signal and the second multi-phase clock signal. As shown in FIG. 10, the reference multi-phase clock signal is PH0D.

The output of the first logic gate 1011 is fed into the non-inverting input of the first comparator 1002 through the first filter 1012. The output of the second logic gate 1021 is fed into the inverting input of the first comparator 1002 through the second filter 1022. Both filters 1012 and 1022 are RC filters similar to the filter 412 described above with respect to FIG. 7.

The first comparator 1002 is configured to compare the output of the first logic gate 1011 with an output of the second logic gate 1021, and generate the second control signal VC2 to adjust the skew of the second multi-phase clock signal PH90D through adjusting a second delay applied to the second multi-phase clock signal until a calibrated signal PH90C of the second multi-phase clock signal is achieved.

Figure 11:
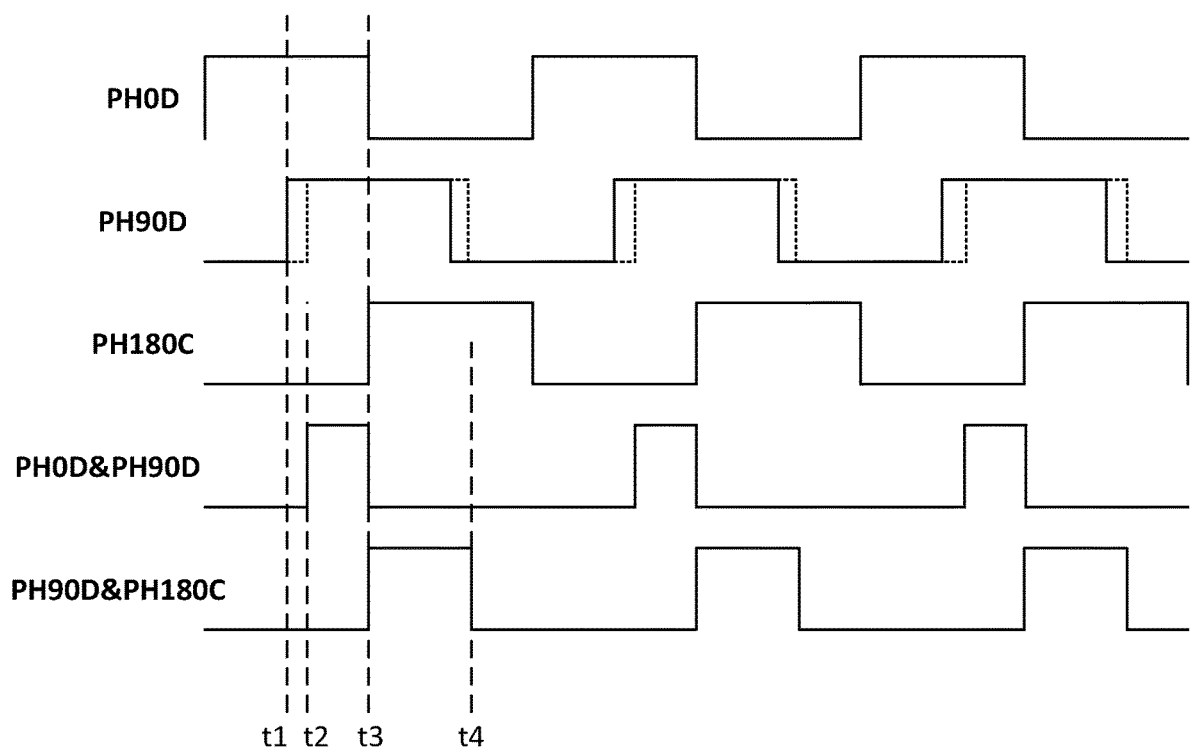
FIG. 11 illustrates various waveforms associated with of the second clock skew calibration unit in accordance with various embodiments of the present disclosure.

FIG. 11 illustrates various waveforms associated with of the second clock skew calibration unit in accordance with various embodiments of the present disclosure. The horizontal axis of FIG. 11 represents intervals of time. There may be five rows in FIG. 11. The first row represents PH0D. The second row represents PH90D. The third row represents PH180C. The fourth row represents a result after an AND operation performed on PH0D and PH90D. The fifth row represents a result after an AND operation performed on PH90D and PH180C.

PH90D is the clock signal to be calibrated. There is a skew at PH90D. This skew is indicated by the dashed line between t1 and t2. The output of the second logic gate 1021 (PH0D&PH90D) has a logic high state from t2 to t3. The output of the first logic gate 1011 (PH90D&PH180C) has a logic high state from t3 to t4. When PH90D lags, the duty cycle of the output of the first logic gate 1011 is greater than the duty cycle of the output of the second logic gate 1021. This duty cycle difference can be used to generate the second control signal VC2 as shown in FIG. 10. For example, in response to VC2, the delay added into PH90D is reduced so as to make the duty cycle of the output of the first logic gate 1011 equal to the duty cycle of the output of the second logic gate 1021. Once these two duty cycles are equal, the corresponding delay is an appropriate delay added into PH90. Under this appropriate delay, the output PH90C is the calibrated signal of PH90.

Figure 12:
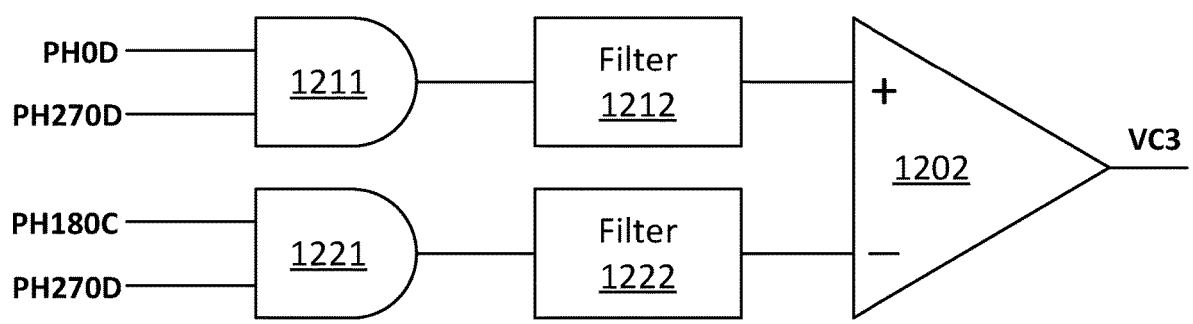
FIG. 12 illustrates a schematic diagram of the third clock skew calibration unit shown in FIG. 1 in accordance with various embodiments of the present disclosure.

FIG. 12 illustrates a schematic diagram of the third clock skew calibration unit shown in FIG. 1 in accordance with various embodiments of the present disclosure. The third clock skew calibration unit 123 comprises a third logic gate 1211, a fourth logic gate 1221, a third filter 1212, a fourth filter 1222 and a second comparator 1202. The third logic gate 1211 and the fourth logic gate 1221 are implemented as AND gates.

The third logic gate 1211 is configured to perform a third AND operation on a reference multi-phase clock signal and a third multi-phase clock signal. As shown in FIG. 12, the reference multi-phase clock signal is PH0D. The third multi-phase clock signal is PH270D.

The fourth logic gate 1221 is configured to perform a fourth AND operation on calibrated signal of the first multi-phase clock signal and the third multi-phase clock signal. As shown in FIG. 12, the calibrated signal of the first multi-phase clock signal is PH180C.

The output of the third logic gate 1211 is fed into the non-inverting input of the second comparator 1202 through the third filter 1212. The output of the fourth logic gate 1221 is fed into the inverting input of the second comparator 1202 through the fourth filter 1222. Both filters 1212 and 1222 are RC filters similar to the filter 412 described above with respect to FIG. 7.

The second comparator 1202 is configured to compare the output of the third logic gate 1211 with an output of the fourth logic gate 1221, and generate the third control signal VC3 to adjust the skew of the third multi-phase clock signal PH270 through adjusting a third delay applied to the third multi-phase clock signal until a calibrated signal of the third multi-phase clock signal is achieved.

Figure 13:
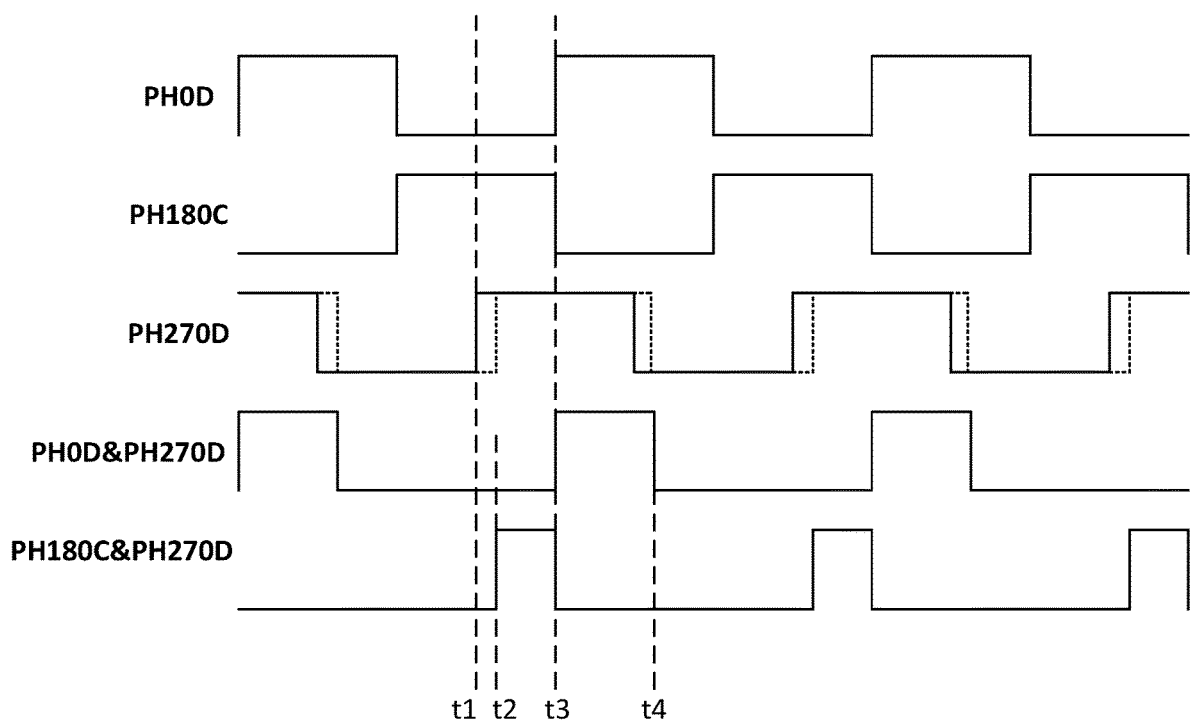
FIG. 13 illustrates various waveforms associated with of the third clock skew calibration unit in accordance with various embodiments of the present disclosure.

FIG. 13 illustrates various waveforms associated with of the third clock skew calibration unit in accordance with various embodiments of the present disclosure. The horizontal axis of FIG. 13 represents intervals of time. There may be five rows in FIG. 13. The first row represents PH0D. The second row represents PH180C. The third row represents PH270D. The fourth row represents a result after an AND operation performed on PH0D and PH270D. The fifth row represents a result after an AND operation performed on PH180C and PH270D.

PH270D is the clock signal to be calibrated. There is a skew at PH270D. This skew is indicated by the dashed line between t1 and t2. The output of the third logic gate 1211 (PH0D&PH270D) has a logic high state from t3 to t4. The output of the fourth logic gate 1221 (PH180C&PH270D) has a logic high state from t2 to t3. When PH270D lags, the duty cycle of the output of the third logic gate 1211 is greater than the duty cycle of the output of the fourth logic gate 1221. This duty cycle difference can be used to generate the third control signal VC3 as shown in FIG. 12. For example, in response to VC3, the delay added into PH270 is reduced so as to make the duty cycle of the output of the fourth logic gate 1221 equal to the duty cycle of the output of the third logic gate 1211. Once these two duty cycles are equal, the corresponding delay is an appropriate delay added into PH270. Under this appropriate delay, the output PH270C is the calibrated signal of PH270.

Figure 14:
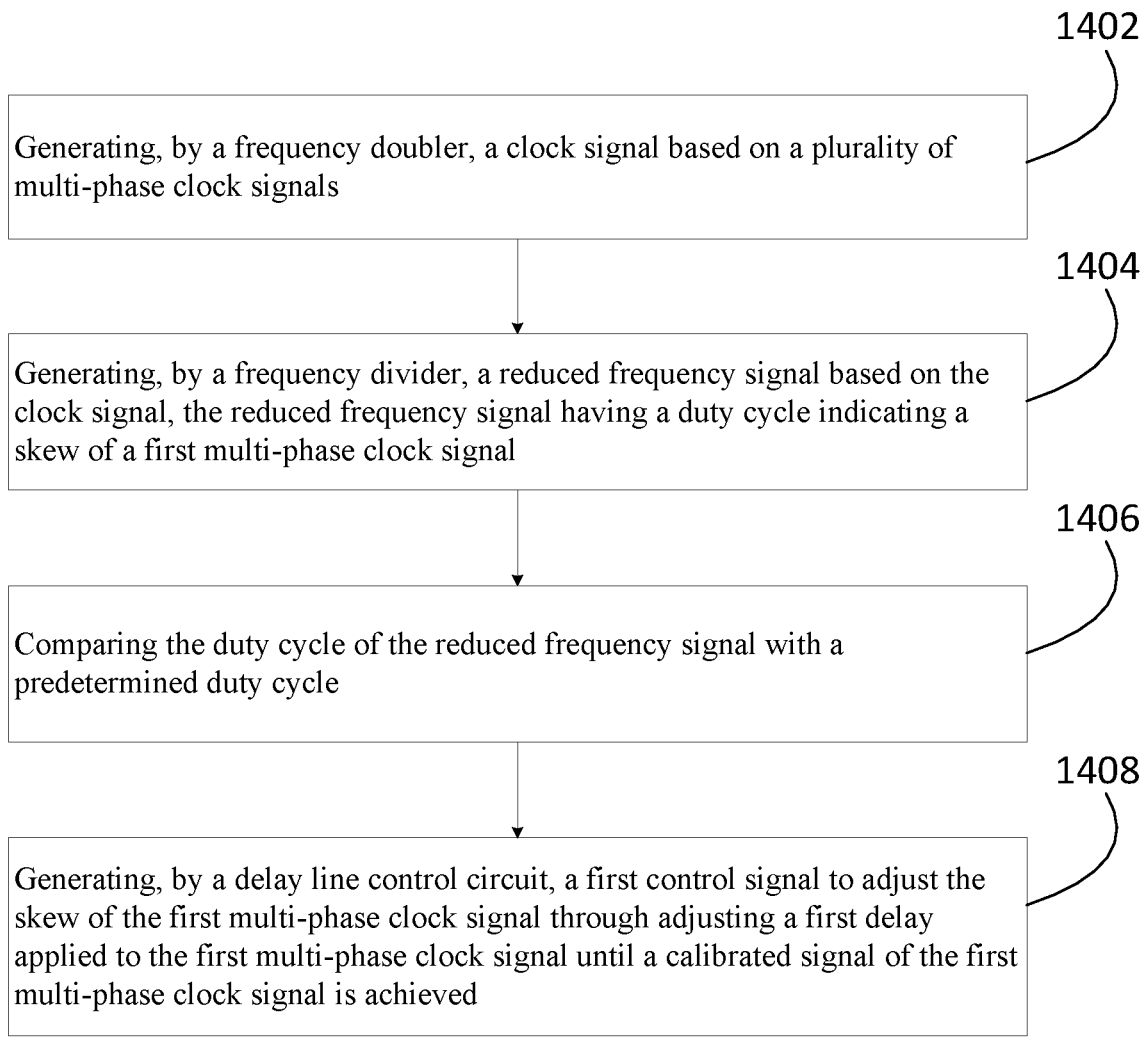
FIG. 14 illustrates a flow chart of controlling the clock signal skew calibration circuit shown in FIG. 1 in accordance with various embodiments of the present disclosure.

FIG. 14 illustrates a flow chart of controlling the clock signal skew calibration circuit shown in FIG. 1 in accordance with various embodiments of the present disclosure. This flowchart shown in FIG. 14 is merely an example, which should not unduly limit the scope of the claims. One of ordinary skill in the art would recognize many variations, alternatives, and modifications. For example, various steps illustrated in FIG. 14 may be added, removed, replaced, rearranged and repeated.

Referring back to FIG. 1, the clock signal skew calibration circuit comprises a first clock skew calibration unit 121, a second clock skew calibration unit 122 and a third clock skew calibration unit 123. Referring back to FIG. 4, the first clock skew calibration unit 121 comprises a frequency doubler 402, a frequency divider 404, a latch circuit 406, a buffer 408, a delay line control circuit 410 and a filter 412.

At step 1402, a clock signal is generated by a frequency doubler based on a plurality of multi-phase clock signals.

At step 1404, a reduced frequency signal is generated, by a frequency divider, based on the clock signal. The reduced frequency signal has a duty cycle indicating a skew of a first multi-phase clock signal.

At step 1406, the duty cycle of the reduced frequency signal is compared with a predetermined duty cycle.

At step 1408, a first control signal is generated by a delay line control circuit. The first control signal is used to adjust the skew of the first multi-phase clock signal through adjusting a first delay applied to the first multi-phase clock signal until a calibrated signal of the first multi-phase clock signal is achieved.

The method further comprises performing a first AND operation on the calibrated signal of the first multi-phase clock signal and a second multi-phase clock signal, performing a second AND operation on a reference multi-phase clock signal and the second multi-phase clock signal, and comparing a result of the first AND operation with a result of the second AND operation, and based on a comparison result from the step of comparing the result of the first AND operation with the result of the second AND operation, generating a second control signal to adjust a skew of the second multi-phase clock signal through adjusting a second delay applied to the second multi-phase clock signal until a calibrated signal of the second multi-phase clock signal is achieved.

The method further comprises performing a third AND operation on the calibrated signal of the first multi-phase clock signal and a third multi-phase clock signal, performing a fourth AND operation on the reference multi-phase clock signal and the third multi-phase clock signal, and comparing a result of the third AND operation with a result of the fourth AND operation, and based on a comparison result from the step of comparing the result of the third AND operation with the result of the fourth AND operation, generating a third control signal to adjust a skew of the third multi-phase clock signal through adjusting a third delay applied to the third multi-phase clock signal until a calibrated signal of the third multi-phase clock signal is achieved.

The method further comprises generating, by a multi-phase clock generator, 4-phase clock signals comprising a 0-degree clock signal, a 90-degree clock signal, a 180-degree clock signal and a 270-degree clock signal, wherein the reference multi-phase clock signal is the 0-degree clock signal, the first multi-phase clock signal is the 180-degree clock signal, the second multi-phase clock signal is the 90-degree clock signal, and the third multi-phase clock signal is the 270-degree clock signal.

In some embodiments, the multi-phase clock generator comprises a first oscillator, a second oscillator, a third oscillator and a fourth oscillator connected in cascade, and wherein an inverting output of the first oscillator is connected to a non-inverting input of the second oscillator, wherein the inverting output of the first oscillator is configured to generate the 270-degree clock signal, a non-inverting output of the first oscillator is connected to an inverting input of the second oscillator, an inverting output of the second oscillator is connected to a non-inverting input of the third oscillator, wherein the inverting output of the second oscillator is configured to generate the 180-degree clock signal, a non-inverting output of the second oscillator is connected to an inverting input of the third oscillator, an inverting output of the third oscillator is connected to a non-inverting input of the fourth oscillator, wherein the inverting output of the third oscillator is configured to generate the 90-degree clock signal, a non-inverting output of the third oscillator is connected to an inverting input of the fourth oscillator, an inverting output of the fourth oscillator is connected to a non-inverting input of the first oscillator, wherein the inverting output of the fourth oscillator is configured to generate the 0-degree clock signal, and a non-inverting output of the fourth oscillator is connected to an inverting input of the first oscillator.

In some embodiments, the frequency divider is a latch circuit, and the frequency doubler comprises a first transmission gate and a second transmission gate, and wherein an input of the first transmission gate is configured to receive the 0-degree clock signal, an output of the first transmission gate is connected to an output of the frequency doubler, a first control terminal of the first transmission gate is configured to receive the 90-degree clock signal, a second control terminal of the first transmission gate is configured to receive the 270-degree clock signal, an input of the second transmission gate is configured to receive the 180-degree clock signal, an output of the second transmission gate is connected to the output of the frequency doubler, a first control terminal of the second transmission gate is configured to receive the 270-degree clock signal, and a second control terminal of the second transmission gate is configured to receive the 90-degree clock signal.

The method further comprises converting the reduced frequency signal into a dc signal, wherein a voltage of the dc signal is proportional to the duty cycle of the reduced frequency signal, and comparing the voltage of the dc signal with a reference voltage proportional to the predetermined duty cycle to obtain the first control signal.

In some embodiments, the delay line control circuit comprises an inverter, a first switch, a second switch, a third switch, a fourth switch and a third comparator, and wherein the inverter is configured to receive a direction control signal and generate an inverted signal of the direction control signal, a first drain/source terminal of the first switch is configured to receive the dc signal, a second drain/source terminal of the first switch is connected to a non-inverting input of the third comparator, a gate of the first switch is controlled by the direction control signal, a first drain/source terminal of the second switch is configured to receive the reference voltage proportional to the predetermined duty cycle, a second drain/source terminal of the second switch is connected to the non-inverting input of the third comparator, a gate of the second switch is controlled by the inverted signal of the direction control signal, a first drain/source terminal of the third switch is configured to receive the dc signal, a second drain/source terminal of the third switch is connected to an inverting input of the third comparator, a gate of the third switch is controlled by the inverted signal of the direction control signal, a first drain/source terminal of the fourth switch is configured to receive the reference voltage proportional to the predetermined duty cycle, a second drain/source terminal of the fourth switch is connected to the inverting input of the third comparator, a gate of the fourth switch is controlled by the direction control signal, and an output of the third comparator is configured to generate the first control signal.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a clock skew calibration circuit configured to be coupled to a multi-phase clock generator through a plurality of delay lines, wherein a first clock skew calibration unit of the clock skew calibration circuit comprises:
a frequency doubler configured to receive a plurality of multi-phase clock signals and generate a clock signal based on the plurality of multi-phase clock signals;
a frequency divider configured to receive the clock signal and generate a reduced frequency signal based on the clock signal, the reduced frequency signal having a duty cycle indicating a skew of a first multi-phase clock signal; and
a delay line control circuit configured to compare the duty cycle of the reduced frequency signal with a predetermined duty cycle, and generate a first control signal to adjust the skew of the first multi-phase clock signal through adjusting a first delay applied to the first multi-phase clock signal until a calibrated signal of the first multi-phase clock signal is achieved.

2. The apparatus of claim 1, wherein a second clock skew calibration unit of the clock skew calibration circuit comprises:
a first logic gate configured to perform a first AND operation on the calibrated signal of the first multi-phase clock signal and a second multi-phase clock signal;
a second logic gate configured to perform a second AND operation on a reference multi-phase clock signal and the second multi-phase clock signal; and
a first comparator configured to compare an output of the first logic gate with an output of the second logic gate, and generate a second control signal to adjust a skew of the second multi-phase clock signal through adjusting a second delay applied to the second multi-phase clock signal until a calibrated signal of the second multi-phase clock signal is achieved.

3. The apparatus of claim 2, wherein a third clock skew calibration unit of the clock skew calibration circuit comprises:
a third logic gate configured to perform a third AND operation on the calibrated signal of the first multi-phase clock signal and a third multi-phase clock signal;
a fourth logic gate configured to perform a fourth AND operation on the reference multi-phase clock signal and the third multi-phase clock signal; and
a second comparator configured to compare an output of the third logic gate with an output of the fourth logic gate, and generate a third control signal to adjust a skew of the third multi-phase clock signal through adjusting a third delay applied to the third multi-phase clock signal until a calibrated signal of the third multi-phase clock signal is achieved.

4. The apparatus of claim 3, wherein:
the multi-phase clock generator is configured to generate 4-phase clock signals comprising a 0-degree clock signal, a 90-degree clock signal, a 180-degree clock signal and a 270-degree clock signal, and wherein:
   the reference multi-phase clock signal is the 0-degree clock signal;
   the first multi-phase clock signal is the 180-degree clock signal;
   the second multi-phase clock signal is the 90-degree clock signal; and
   the third multi-phase clock signal is the 270-degree clock signal.

5. The apparatus of claim 1, wherein the frequency doubler comprises a first transmission gate and a second transmission gate, and wherein:
   an input of the first transmission gate is configured to receive the 0-degree clock signal;
   an output of the first transmission gate is connected to an output of the frequency doubler;
   a first control terminal of the first transmission gate is configured to receive the 90-degree clock signal;
   a second control terminal of the first transmission gate is configured to receive the 270-degree clock signal;
   an input of the second transmission gate is configured to receive the 180-degree clock signal;
   an output of the second transmission gate is connected to the output of the frequency doubler;
   a first control terminal of the second transmission gate is configured to receive the 270-degree clock signal;
   a second control terminal of the second transmission gate is configured to receive the 90-degree clock signal.

6. The apparatus of claim 1, wherein the first clock skew calibration unit further comprises:
   a latch circuit configured to generate a direction control signal; and
   a filter configured to receive the reduced frequency signal and generate a dc signal, wherein a voltage of the dc signal is proportional to the duty cycle of the reduced frequency signal.

7. The apparatus of claim 6, wherein the delay line control circuit comprises an inverter, a first switch, a second switch, a third switch, a fourth switch and a third comparator, and wherein:
   the inverter is configured to receive the direction control signal and generate an inverted signal of the direction control signal;
   a first drain/source terminal of the first switch is configured to receive the dc signal;
   a second drain/source terminal of the first switch is connected to a non-inverting input of the third comparator;
   a gate of the first switch is controlled by the direction control signal;
   a first drain/source terminal of the second switch is configured to receive a reference voltage proportional to the predetermined duty cycle;
   a second drain/source terminal of the second switch is connected to the non-inverting input of the third comparator;
   a gate of the second switch is controlled by the inverted signal of the direction control signal;
   a first drain/source terminal of the third switch is configured to receive the dc signal;
   a second drain/source terminal of the third switch is connected to an inverting input of the third comparator;
   a gate of the third switch is controlled by the inverted signal of the direction control signal;
   a first drain/source terminal of the fourth switch is configured to receive the reference voltage proportional to the predetermined duty cycle;
   a second drain/source terminal of the fourth switch is connected to the inverting input of the third comparator;
   a gate of the fourth switch is controlled by the direction control signal; and
   an output of the third comparator is configured to generate the first control signal.

8. The apparatus of claim 1, wherein the first delay is generated by a first delay line, and wherein the first delay line comprises:
   a biasing circuit comprising an upper transistor and a lower transistor connected in series between a supply voltage and ground; and
   a plurality of inverting legs connected in parallel between the supply voltage and ground, and wherein each inverting leg comprises a first transistor, a second transistor, a third transistor and a fourth transistor connected in series, and wherein:
      a gate of the first transistor is connected to a gate of the upper transistor;
      a gate of the second transistor and a gate of the third transistor are connected together and function as an input of an inverting leg, and a midpoint of the inverting leg functions as an output of the inverting leg, and
      a gate of the fourth transistor is connected to a gate of the lower transistor, and wherein:
         an input of a first inverting leg of the plurality of inverting legs is configured to receive the first multi-phase clock signal;
         an output of the first inverting leg of the plurality of inverting legs is connected to an input of a second inverting leg of the plurality of inverting legs; and
         an output of a last inverting leg of the plurality of inverting legs is configured to generate the calibrated signal of the first multi-phase clock signal.

9. A method comprising:
generating, by a frequency doubler, a clock signal based on a plurality of multi-phase clock signals;
generating, by a frequency divider, a reduced frequency signal based on the clock signal, the reduced frequency signal having a duty cycle indicating a skew of a first multi-phase clock signal;
comparing the duty cycle of the reduced frequency signal with a predetermined duty cycle; and
generating, by a delay line control circuit, a first control signal to adjust the skew of the first multi-phase clock signal through adjusting a first delay applied to the first multi-phase clock signal until a calibrated signal of the first multi-phase clock signal is achieved.

10. The method of claim 9, further comprising:
performing a first AND operation on the calibrated signal of the first multi-phase clock signal and a second multi-phase clock signal;
performing a second AND operation on a reference multi-phase clock signal and the second multi-phase clock signal; and
comparing a result of the first AND operation with a result of the second AND operation; and
based on a comparison result from the step of comparing the result of the first AND operation with the result of the second AND operation, generating a second control signal to adjust a skew of the second multi-phase clock signal through adjusting a second delay applied to the second multi-phase clock signal until a calibrated signal of the second multi-phase clock signal is achieved.

11. The method of claim 10, further comprising:
performing a third AND operation on the calibrated signal of the first multi-phase clock signal and a third multi-phase clock signal;
performing a fourth AND operation on the reference multi-phase clock signal and the third multi-phase clock signal; and
comparing a result of the third AND operation with a result of the fourth AND operation; and
based on a comparison result from the step of comparing the result of the third AND operation with the result of the fourth AND operation, generating a third control signal to adjust a skew of the third multi-phase clock signal through adjusting a third delay applied to the third multi-phase clock signal until a calibrated signal of the third multi-phase clock signal is achieved.

12. The method of claim 11, further comprising:
generating, by a multi-phase clock generator, 4-phase clock signals comprising a 0-degree clock signal, a 90-degree clock signal, a 180-degree clock signal and a 270-degree clock signal, wherein:
the reference multi-phase clock signal is the 0-degree clock signal;
the first multi-phase clock signal is the 180-degree clock signal;
the second multi-phase clock signal is the 90-degree clock signal; and
the third multi-phase clock signal is the 270-degree clock signal.

13. The method of claim 12, wherein the multi-phase clock generator comprises a first oscillator, a second oscillator, a third oscillator and a fourth oscillator connected in cascade, and wherein:
an inverting output of the first oscillator is connected to a non-inverting input of the second oscillator, wherein the inverting output of the first oscillator is configured to generate the 270-degree clock signal;
a non-inverting output of the first oscillator is connected to an inverting input of the second oscillator;
an inverting output of the second oscillator is connected to a non-inverting input of the third oscillator, wherein the inverting output of the second oscillator is configured to generate the 180-degree clock signal;
a non-inverting output of the second oscillator is connected to an inverting input of the third oscillator;
an inverting output of the third oscillator is connected to a non-inverting input of the fourth oscillator, wherein the inverting output of the third oscillator is configured to generate the 90-degree clock signal;
a non-inverting output of the third oscillator is connected to an inverting input of the fourth oscillator;
an inverting output of the fourth oscillator is connected to a non-inverting input of the first oscillator, wherein the inverting output of the fourth oscillator is configured to generate the 0-degree clock signal; and
a non-inverting output of the fourth oscillator is connected to an inverting input of the first oscillator.

14. The method of claim 12, wherein:
the frequency divider is a latch circuit; and
the frequency doubler comprises a first transmission gate and a second transmission gate, and wherein:
an input of the first transmission gate is configured to receive the 0-degree clock signal;
an output of the first transmission gate is connected to an output of the frequency doubler;
a first control terminal of the first transmission gate is configured to receive the 90-degree clock signal;
a second control terminal of the first transmission gate is configured to receive the 270-degree clock signal;
an input of the second transmission gate is configured to receive the 180-degree clock signal;
an output of the second transmission gate is connected to the output of the frequency doubler;
a first control terminal of the second transmission gate is configured to receive the 270-degree clock signal; and
a second control terminal of the second transmission gate is configured to receive the 90-degree clock signal.

15. The method of claim 9, further comprising:
converting the reduced frequency signal into a dc signal, wherein a voltage of the dc signal is proportional to the duty cycle of the reduced frequency signal; and
comparing the voltage of the dc signal with a reference voltage proportional to the predetermined duty cycle to obtain the first control signal.

16. The method of claim 15, wherein the delay line control circuit comprises an inverter, a first switch, a second switch, a third switch, a fourth switch and a third comparator, and wherein:
the inverter is configured to receive a direction control signal and generate an inverted signal of the direction control signal;
a first drain/source terminal of the first switch is configured to receive the dc signal;
a second drain/source terminal of the first switch is connected to a non-inverting input of the third comparator;
a gate of the first switch is controlled by the direction control signal;
a first drain/source terminal of the second switch is configured to receive the reference voltage proportional to the predetermined duty cycle;
a second drain/source terminal of the second switch is connected to the non-inverting input of the third comparator;
a gate of the second switch is controlled by the inverted signal of the direction control signal;
a first drain/source terminal of the third switch is configured to receive the dc signal;
a second drain/source terminal of the third switch is connected to an inverting input of the third comparator;
a gate of the third switch is controlled by the inverted signal of the direction control signal;
a first drain/source terminal of the fourth switch is configured to receive the reference voltage proportional to the predetermined duty cycle;
a second drain/source terminal of the fourth switch is connected to the inverting input of the third comparator;
a gate of the fourth switch is controlled by the direction control signal; and
an output of the third comparator is configured to generate the first control signal.

17. A system comprising:
a multi-phase clock generator configured to generate a plurality of multi-phase clock signals;
a plurality of delay lines configured to receive respective multi-phase clock signals; and a clock skew calibration circuit configured to be coupled to the multi-phase clock generator through the plurality of delay lines, wherein of the clock skew calibration circuit comprises a first clock skew calibration unit, a second clock skew calibration unit and a third clock skew calibration unit, and wherein the first clock skew calibration unit comprises:
- a frequency doubler configured to receive the plurality of multi-phase clock signals and generate a clock signal based on the plurality of multi-phase clock signals;
- a frequency divider configured to receive the clock signal and generate a reduced frequency signal based on the clock signal, the reduced frequency signal having a duty cycle indicating a skew of a first multi-phase clock signal; and
- a delay line control circuit configured to compare the duty cycle of the reduced frequency signal with a predetermined duty cycle, and generate a first control signal to adjust a first delay applied to the first multi-phase clock signal until a calibrated signal of the first multi-phase clock signal is achieved.

18. The system of claim 17, wherein:
the second clock skew calibration unit of the clock skew calibration circuit comprises:
- a first logic gate configured to perform a first AND operation on the calibrated signal of the first multi-phase clock signal and a second multi-phase clock signal;
- a second logic gate configured to perform a second AND operation on a reference multi-phase clock signal and the second multi-phase clock signal; and
- a first comparator configured to compare an output of the first logic gate with an output of the second logic gate, and generate a second control signal to adjust a second delay applied to the second multi-phase clock signal until a calibrated signal of the second multi-phase clock signal is achieved; and the third clock skew calibration unit of the clock skew calibration circuit comprises:
- a third logic gate configured to perform a third AND operation on the calibrated signal of the first multi-phase clock signal and a third multi-phase clock signal;
- a fourth logic gate configured to perform a fourth AND operation on the reference multi-phase clock signal and the third multi-phase clock signal; and
- a second comparator configured to compare an output of the third logic gate with an output of the fourth logic gate, and generate a third control signal to adjust a third delay applied to the third multi-phase clock signal until a calibrated signal of the third multi-phase clock signal is achieved.

19. The system of claim 18, wherein:
the multi-phase clock generator is configured to generate 4-phase clock signals comprising a 0-degree clock signal, a 90-degree clock signal, a 180-degree clock signal and a 270-degree clock signal, and wherein:
- the reference multi-phase clock signal is the 0-degree clock signal;
- the first multi-phase clock signal is the 180-degree clock signal;
- the second multi-phase clock signal is the 90-degree clock signal; and
- the third multi-phase clock signal to be calibrated is the 270-degree clock signal.

20. The system of claim 19, wherein:
- a first delay line of the plurality of delay lines is configured to receive the 0-degree clock signal and a predetermined reference signal, and add a predetermined delay into the 0-degree clock signal based on the predetermined reference signal;
- a second delay line of the plurality of delay lines is configured to receive the 180-degree clock signal and the first control signal, and add the first delay into the 180-degree clock signal based on the first control signal;
- a third delay line of the plurality of delay lines is configured to receive the 90-degree clock signal and the second control signal, and add the second delay into the 90-degree clock signal based on the second control signal; and
- a fourth delay line of the plurality of delay lines is configured to receive the 270-degree clock signal and the third control signal, and add the third delay into the 270-degree clock signal based on the third control signal.

* * * * *